United States Patent [19]

Ogawa

[11] 4,403,346
[45] Sep. 6, 1983

[54] AGC SYSTEM FOR WIDE BAND TUNER
[75] Inventor: Shigeo Ogawa, Kawaguchi, Japan
[73] Assignee: Tokyo Shibaura Denki Kabushiki Kaisha, Kawasaki, Japan
[21] Appl. No.: 320,437
[22] Filed: Nov. 12, 1981
[30] Foreign Application Priority Data
Nov. 19, 1980 [JP] Japan ............... 55-162779
[51] Int. Cl.³ .............................. H04B 1/26
[52] U.S. Cl. .................. 455/189; 455/200; 455/241; 455/242; 455/251
[58] Field of Search ........... 455/188, 189, 190, 241, 455/242, 243, 251, 200, 314, 315; 358/174, 179

[56] References Cited
PUBLICATIONS
IEEE Transactions on Consumer Electronics, "High Performance Receiver", Darrell L. Ash, Feb. 1978, pp. 39–46.

Primary Examiner—Marc E. Bookbinder
Attorney, Agent, or Firm—Oblon, Fisher, Spivak, McClelland & Maier

[57] ABSTRACT

Disclosed is an AGC system for a double superheterodyne TV tuner which has a first AGC circuit for providing a level-controlled RF signal including UHF/VHF components, an RF circuit for separating the UHF and VHF components individually from the level-controlled RF signal, a UHF/VHF selection switch for selecting either the UHF or VHF component to provide an RF output, a second AGC circuit coupled directly with the UHF/VHF selection switch for level-controlling the RF output, and an AGC signal source responsive to the RF output level for governing the first and second AGC circuits to perform a delayed AGC operation.

The gain of first AGC circuit is fixed at its maximum and the gain of second AGC circuit is variable when the level of an antenna input applied to the first AGC circuit is low. Whereas the gain of first AGC circuit is variable when the antenna input level is high.

13 Claims, 11 Drawing Figures

AGC SYSTEM FOR WIDE BAND TUNER

BACKGROUND OF THE INVENTION

The present invention relates to an AGC system for a wide band tuner, particularly to the improvement on noise figure (NF) of a wide band TV tuner suitable for forming a double superheterodyne system.

In recent years many proposals for a wide band TV tuner employing a double superheterodyne system have been made. This is because, in the double superheterodyne system, an image frequency interference or the like influenced on a TV picture may be side-stepped or suppressed by means of an appropriate selection of higher intermediate frequency. Further, it is possible to receive not only TV signals of VHF and UHF frequency bands but cable TV signals etc., with the expansion of receiving frequency range of the tuner, and also possible to simplify the tuner configuration to reduce the manufacturing cost.

A typical wide band TV tuner will be explained below with referring to FIG. 1. In this figure numeral 1 denotes an input terminal for receiving an input signal from an antenna (not shown). The antenna input signal is supplied to an automatic gain controlled circuit (hereinafter referred to as the "AGC circuit") 2, and the level of magnitude of input signal is properly controlled therein. When the input signal or receiving signal is a VHF signal (inclusive of a cable TV signal), an output signal of the AGC circuit 2 is applied to a wide range radio frequency amplifier for VHF band (a VHF RF amplifier) 5a, through a VHF band-pass filter (BPF) 3a and 3b and a frequency band selector 4. The above output signal of AGC circuit 2 passes either the BPF 3a or 3b according to its specific frequency. An output signal of the selector 4 is amplified by the RF amplifier 5a. An output signal of the RF amplifier 5a is supplied to a UHF/VHF selection switch 7 through a frequency selective circuit of a VHF low-pass filter (LPF) 6a. The LPF 6a sufficiently suppresses the frequency components of image interferences. While the said receiving signal from antenna is a UHF signal, the output signal of the AGC circuit 2 is applied to a wide range radio frequency amplifier for UHF band (a UHF RF amplifier) 5b through a BPF 3c which passes frequency components of UHF. An output signal of the RF amplifier 5b amplified therein is supplied to the UHF/VHF selection switch 7 through a frequency selective circuit or a UHF LPF 6b. The components 3 to 6 form an RF circuit 40.

The signals supplied to the UHF/VHF switch 7 is alternatively selected by the switch 7 as a selected signal corresponding to a VHF signal or a UHF signal. The selected signal is applied to a first frequency mixer 8. Also applied to the mixer 8 is a frequency conversion signal obtained from a local oscillator 9. The mixer 8 converts the VHF or UFH signal inputted therein to a first IF signal by mixing the input signal with the frequency conversion signal.

The first IF signal filtered by a first IF BPF 31 is amplified by a first IF amplifier 30 and then filtered again by a first IF BPF 32. The components 8, 9, 30, 31 and 32 form a first superheterodyne section. An output signal of this section or a filtered output of the BPF 32 is supplied to a second superheterodyne section 34 which may have a well-known single superheterodyne configuration. In the section 34 the output of BPF 32 is converted into a second IF signal available for a conventional single superheterodyne tuner. The section 34 outputs a demodulated picture signal and generates a control voltage $V_{AGC}$ for AGC which corresponds to the magnitude of the aforementioned antenna input. The control voltage $V_{AGC}$ is applied to the AGC circuit 2 for gain-controlling.

Figure 2:
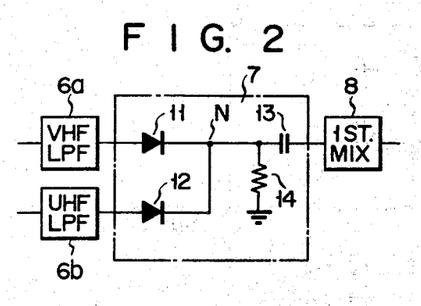
FIG. 2 shows a configuration of a conventional UHF/VHF selection switch for a wide band TV tuner.

FIG. 2 shows a conventional circuit of UHF/VHF selection switch 7. In this figure numerals 6a and 6b indicate VHF LPF and UHF LPF which are prestages of the switch 7. The switch 7 includes a switching diode 11 whose anode is connected to the LPF 6a, a switching diode 12 whose anode is connected to the LPF 6b, a DC blocking capacitor 13 for coupling the cathodes of the diodes 11 and 12 with the first frequency mixer 8 of following stages, and a resistor 14 connected between the output nodes of the diodes 11, 12 and the circuit ground. The cathodes or output nodes of diode 11 and 12 is refered as a coupling node N.

The UHF/VHF selection switch 7 operates as follows. Suppose that a VHF receiving signal as mentioned before is fed to the switch 7 through the wide band RF amplifier 5a and the LPF 6a. In this case, when a power supply voltage of VHF circuit is applied to the switching diode 11 in a manner that the power supply voltage forwardly biases the diode 11, a DC current is flows through the diode 11 and the resistor 14 to a circuit ground thereby to render the switching diode 11 conductive. Then, the VHF signal is fed through the DC blocking capacitor 13 to the first frequency mixer 8. At this time, since the voltage potential of a UHF power supply is zero, the switching diode 12 is reversely biased to render the diode 12 nonconductive.

When a UHF receiving signal is fed through the wide band RF amplifier 5b and the LPF 6b to the switch 7, the switching diode 12 of UHF side is rendered conductive and the switching diode 11 of VHF side is rendered nonconductive, contrary to the aforementioned case. In this case only the UHF signal is fed to the first frequency mixer 8 through the DC blocking capacitor 13.

One of the differences between a double superheterodyne type tuner and a single superheterodyne type tuner appears in an AGC circuit. In case of a single superheterodyne tuner, the AGC is generally performed at a tuning amplifier or an RF amplifier. While, in case of a double superheterodyne tuner in which a wide band RF amplifier as mentioned is used, it is hard to realize an AGC at the RF amplifier. The difficulty of this is due to the wide frequency range requirement for covering VHF and UFH bands and a necessity of a forward AGC. That is, in a wide band RF amplifier with an AGC circuitry, its frequency response is liable to vary with the AGC operation. In other words, it is difficult to maintain the flat frequency response of RF amplifier within the full AGC operating range. Further, the use of a forward AGC is strongly desired because the harmonic distortion of forward AGC is smaller than that of reverse AGC. In a wide band RF amplifier for VHF and UHF, however, reducing a forward AGC to practice is almost impossible.

Figure 1:
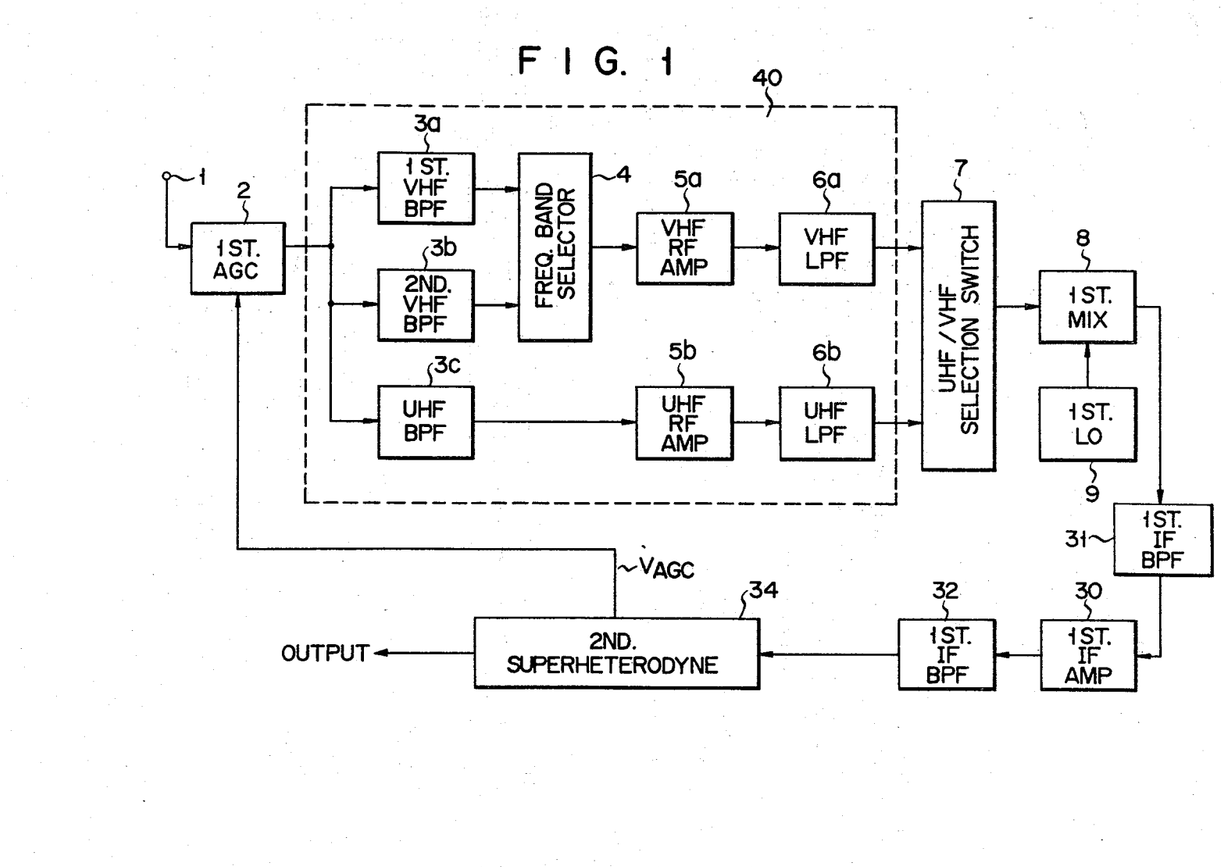
FIG. 1 shows a block diagram of a double superheterodyne type wide band TV tuner being applicable to the present invention.

From reasons mentioned above, in a wide band RF amplifier, the special AGC circuit 2 as shown in FIG. 1 is used. When such AGC circuit 2 is provided in the prestage of RF amplifiers 5a and 5b, an input-referred noise figure (NF) of the tuner is deteriorated with the increase of degree of AGC. In this case an NF of the double superheterodyne system in a medium field strength is more deteriorative than that of the single superheterodyne system. Thus, the picture S/N of a TV employing the double superheterodyne system is degraded within a medium field strength area.

SUMMARY OF THE INVENTION

The present invention has been accomplished to overcome the above-mentioned problem and its objective is to improve the noise figure (NF) of a wide band tuner with AGC function. Particularly, the object of this invention is to provide a wide band TV tuner enabling to suppress the active deterioration or degradation of NF with AGC operation and to improve the S/N of TV picture in such way that, first, the TV tuner is equipped with a first AGC circuit at its input stage, second, a UHF/VHF selection switch of the tuner is provided with a second AGC circuit, and third, the first and second AGC circuits cooperatively form a delayed AGC system.

To achieve the above objective, an AGC system for a wide band tuner of the present invention has: a first AGC circuit for level-controlling an antenna input including UHF and VHF signals and providing a level-controlled RF signal; an RF circuit for separating the UHF signal and the VHF signal from the level-controlled RF signal; a UHF/VHF selection switch for selecting either the UHF signal or the VHF signal to provide an RF output which may be subject to treat a double superheterodyne system; a second AGC circuit coupled with the UHF/VHF selection switch for level-controlling the RF output; and an AGC signal source responsive to a level of the RF output for governing the first and second AGC circuits to carry out a delayed AGC operation.

According to an AGC system having such a configuration mentioned above, the gain of the first AGC circuits is fixed at its maximum and the gain of the second AGC circuit is variable when the level of antenna input is low. Whereas the gain of the first AGC circuit is variable when the antenna input level is high. Therefore, an input-referred NF of the tuner may effectively be improved over a full range of antenna input level. Further, since the second AGC circuit is combined with the circuitry of UHF/VHF selection switch, not independently provided, the total circuit configuration may be simplified to render the manufacturing cost low and to permit the size reduction of the RF section.

DETAILED DESCRIPTION OF THE PREFERRED EMBODIMENT

Before proceeding with the description of the embodiment of the invention, it will expressly be understood that like reference symbols are used to designate like portions throughout the drawings for simplicity of illustration and that the components designated by like reference symbols may easily be replaced with each other or one another with minor change thereof by a skilled person in the art. An embodiment of an AGC system for a wide band tuner according to the invention will be described.

Figure 3:
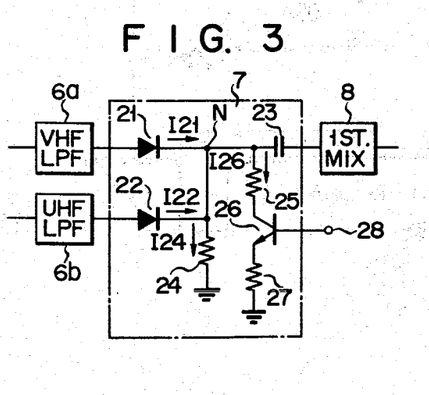
FIG. 3 shows a configuration of a UHF/VHF selection switch including a second AGC circuit according to the present invention wherein the second AGC circuit is formed of the combination of a diode switch and a transistor current divider.

A double superheterodyne TV tuner as shown in FIG. 1 is constructed. The practical configuration of the UHF/VHF selection switch 7 is constituted as shown in FIG. 3. In FIG. 3, numerals 21 and 22 denote switching diodes respectively connected, as shown, to a VHF LPF 6a and a UHF LPF 6b of former stage. Used for each of the diodes 21 and 22 is a PIN diode whose RF equivalent resistance $R_{rf}$ is varied according to a forward bias current $I_F$. The output ends (cathodes) of the diodes 21 and 22 are joined together at a coupling node N and connected through a DC blocking capacitor 23 to a first frequency mixer 8 of following stages. The output ends of diodes 21 and 22 or the node N is connected through a resistor 24 to a circuit ground. The node N is also connected to the circuit ground through a series circuit of a resistor 25, an NPN transistor 26 and a resistor 27, as shown. The collector of the transistor 26 is coupled to the resistor 25, the emitter thereof to the resistor 27, and the base thereof to a base terminal 28.

The circuit configuration of FIG. 3 will operate as follows.

When a VHF receiving signal is inputted from a wide band RF amplifier 5a through the LPF 6a to the UHF/VHF selection switch 7, the switching diode 21 is forwardly biased by a VHF power supply voltage. Accordingly, if a certain voltage is applied to the base terminal 28 of the transistor 26, a forward current I21 (DC) of the diode 21 is divided into a current I24 passing the resistor 24 and a current I26 being fed into the series circuit of resistor 25, transistor 26 and resistor 27. The currents I21 and I26 flow down to the circuit ground. Then, the switching diode 21 is turned on or rendered conductive to feed the VHF signal to the first frequency mixer 8 through the DC blocking capacitor 23. In this case the magnitude of the current I24 is almost constant and following relation is held:

$$I24 \simeq (V_{CV} - V_F)/R24 \qquad (1)$$

where $V_{CV}$ denotes the voltage potential at the anode of the diode 21, $V_F$ a forward voltage drop of the diode 21 and R24 a resistance of the resistor 24. The current I26 is determined by a voltage (control potential) V28 applied to the base terminal 28 of transistor 26 and is expressed, if the current amplification factor $h_{FE}$ of transistor 26 is sufficiently large, as follows.

$$I26 \doteq (V28 - V_{BE})/R27 \qquad (II)$$

where $V_{BE}$ denotes the base-emitter voltage of the transistor 26 and R27 a resistance of the resistor 27. Thus, the current I26 is controlled by the voltage V28. The current I21 passing through the diode 21 is $$I21 = I24 + I26 \qquad (III)$$

Figure 4:
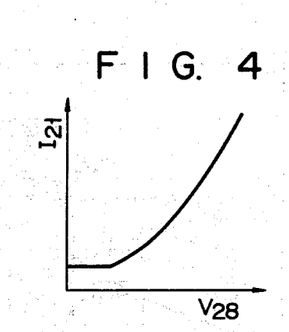
FIG. 4 shows a relation between a switching diode current I21 and a transistor base voltage (AGC signal) V28.
Figure 5:
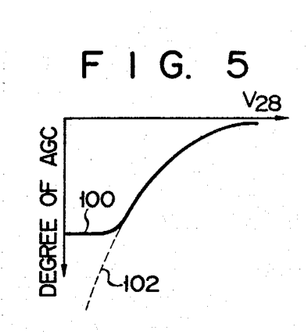
FIG. 5 shows a relation between a transistor base voltage (AGC signal) V28 and a degree of AGC.

As seen from equations (I), (II) and (III), with a certain selection of resistors 24, 25 and 27 well-fitted to $I_F$ vs. $R_{rf}$ characteristic of the diodes 21 and 22, it is possible to control the current I21 by changing the potential of voltage V28 as shown in FIG. 4. Since a loss of the switching diode is inversely proportional to the magnitude of a forward current flowing therethrough, i.e. an internal impedance of the switching diode decreases as the forward current increases, by controlling the base voltage V28 of transistor 26, the switching diode 21 may provide with an AGC performance as shown in FIG. 5. FIG. 5 indicates that a degree of AGC or a degree of signal attenuation decreases as the voltage V28 (gain control potential) increases. The magnitude of current I24 is almost constant and determines a maximum attenuation degree of AGC or a lower limit of the gain of selection switch 7. This lower limit is indicated by a numeral 100 in FIG. 5. If the current I24 is zero, or the resistor 24 is not provided, the lower limit 100 is removed, and the degree of attenuation increases substantially without saturation as shown by a broken line 102 in FIG. 5. Incidentally, since the power supply potential of the UHF side is zero, the switching diode 22 is reversely biased to render the diode 22 nonconductive.

In contrast with the above, when a UHF signal is inputted from a wide band RF amplifier 5b through the LPF 6b to the selection switch 7, the switching diode 22 is turned on. In this case a forward current I22 following through the switching diode 22 is $$I22 = I24 + I26 \qquad (IV)$$

Similar to the case of the diode 21, as seen from equations (I), (II) and (IV), an AGC operation may be performed by the switching diode 22 with the control of the base voltage V28.

As described above an appended AGC function of the UHF/VHF selection switch 7 performs, in cooperation with the AGC circuit 2 of input stage, a delayed AGC. That is, first, the AGC of UHF/VHF selection switch 7 operates until the degree of AGC is saturated, and second, after the AGC saturation of the switch 7 has established, the input stage AGC circuit 2 delayingly operates thereby to improve the input-referred NF.

As to the deterioration of NF, a comparison between the prior art tuner and the tuner of the invention will be discussed. For brevity's sake explanation will be given only to the case of VHF receiving, and the case of UHF will be omitted because the deduction of UHF case is identical with that of VHF case.

In a wide band TV tuner having such a configuration as shown in FIG. 1, a noise figure NF0 of the tuner without AGC will be obtained from the below Friss formula, provided that the insertion loss of each of the VHF BPFs 3a and 3b, the band selector 4, the VHF LPF 6a and the UHF/VHF selection switch 7 is 0 dB, and the minimum attenuation degree (maximum gain) of the AGC circuit 2 is 0 dB:

$$NF0 = NF_A = (NF_M - 1)/G_A \qquad (1)$$

where $NF_A$ denotes a noise figure of RF amplifier 5a, $G_A$ a power gain of RF amplifier 5a, and $NF_M$ a noise figure of the first frequency mixer 8 and the following stages.

When the AGC circuit 2 of input stage attenuates the input signal by an AGC degree of L1, from the Friss formula, a noise figure NF1 of the tuner wil be $$\begin{aligned} NF1 &= L1 \{NF_A + (NF_M - 1)/G_A\} \\ &= L1 \cdot NF0 \end{aligned} \qquad (2)$$

Figure 6:
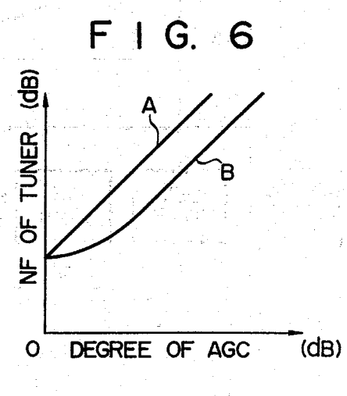
FIG. 6 shows a relation between a degree of AGC and a noise figure of tuner wherein a curve A pertains to a prior art one and a curve B refers to one embodiment of the present invention.

Equation (2) indicates that the noise figure NF1 (dB) deteriorates in proportion to the increment of AGC degree (dB) as shown by a line A in FIG. 6.

While, in the embodiment of this invention, the above-mentioned AGC degree of L1 is effected in the UHF/VHF selection switch 7. In this case a noise figure NF2 of the tuner will be $$NF2 = NF_A + L1(NF_M - 1)/G_A \qquad (3)$$

from the Friss formula. The AGC degree of L1 is effected, at the initial stage (low input level), on the first frequency mixer 8 and the followings. Therefore, as compared with the prior art one, a remarkable improvement of tuner noise figure NF2 may be obtained. A curve B of FIG. 6 shows the relation between the noise figure NF2 (dB) and the increment of AGC degree (dB). When the AGC degree of UHF/VHF selection switch 7 reaches to a given degree, the AGC circuit 2 of input stage is rendered operative. The reason is that the saturation of RF amplifier 5a must be avoided. The maximum AGC degree or the upper limit of attenuation at the UHF/VHF selection switch 7 is determined from the saturation characteristic of RF amplifier 5a and that of the first frequency mixer 8 and the following stages. When the input stage AGC circuit 2 operates, similar to the prior art, the noise figure NF2 of tuner of the invention increases in proportion to the increment of AGC degree as indicated by the linear part of the curve B of FIG. 6. The difference between NF1 (curve A) and NF2 (curve B) relating to the improvement of NF will usually be 5 dB or more.

As described above, according to the embodiment of the present invention, a UHF/VHF selection switch with AGC function may readily be obtained only adding a control circuit (25-27) for controlling a forward current I21 of the switching diode 21 or a forward current I22 of the switching diode 22. Furthermore, it is possible to improve on the noise figure of whole circuitry of tuner by means of a delayed AGC operation performed by the combination of AGC circuit 2 and UHF/VHF selection switch 7.

Figure 7:
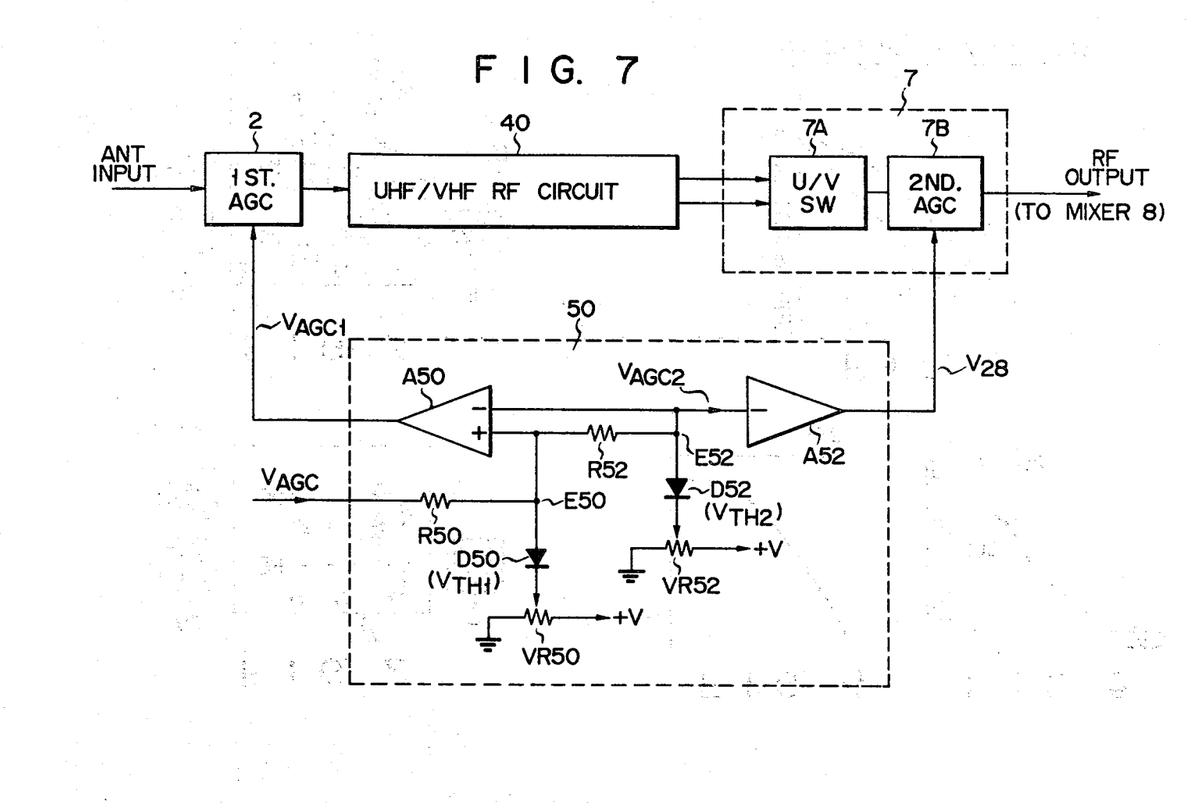
FIG. 7 shows one embodiment of an AGC signal source of the present invention.

FIG. 7 shows an AGC signal source 50 for governing a first AGC circuit 2 of the input stage and a second AGC circuit 7B of the UHF/VHF selection switch 7. A control voltage $V_{AGC}$ derived from the second superheterodyne section 23 of FIG. 1 is applied through a resistor R50 to the noninverted input of a differential amplifier A50. The noninverted input of amplifier A50 is connected through a resistor R52 to the inverted input thereof and to the input of an inverting amplifier A52. The noninverted input of amplifier A50 is connected through the anode-cathode path of a diode D50 to the slider of a trimmer resistor VR50 whose one end is grounded and the other end is supplied with a positive potential +V. The input of amplifier A52 is connected through the anode-cathode path of a diode D52 to the slider of a trimmer resistor VR52 whose one end is grounded and the other end is supplied with the potential +V. The amplifier A50 provides a first gain control signal $V_{AGC1}$ to the first AGC circuit 2. The amplifier A52 provides a control potential (said base voltage) V28 to the second AGC circuit 7B which corresponds to the circuit elements 24 to 27 of FIG. 3. The control potential V28 is corresponding to a second gain control signal $V_{AGC2}$ appearing at the input of amplifier A52. The components R50, R52, VR50, VR52, D50, D52, A50 and A52 form the AGC signal source or control signal source 50.

Now assume that the resistor VR50 is so set the diode D50 is conducted when an anode potential E50 of diode D50 reaches to a given threshold potential $V_{TH1}$, that the resistor VR52 is so adjusted the diode D52 is rendered conductive when an anode potential E52 of diode D52 exceeds a given threshold potential $V_{TH2}$, and that $V_{TH1} > V_{TH2}$. And also assume that VR50<<R50 and VR52<<R52. Under such assumption, the AGC signal source 50 shown in FIG. 7 will operate as follows.

While the potential of the control voltage $V_{AGC}$ falls below $V_{TH2}$, since both diodes D50 and D52 are cut-off, the potential D52 of signal $V_{AGC2}$ is proportional to the potential of $V_{AGC}$ as indicated by a part 200 in FIG. 8. At this time, since the diode D52 is cut-off, the potential E52 is almost equal to the potential E50. Thus the input potential difference E50-E52 of the differential amplifier A50 is substantially zero, and the signal $V_{AGC1}$ outputted from the amplifier A52 holds substantially zero potential as shown by a part 202 in FIG. 8.

When the potential E52 exceeds the potential $V_{TH2}$ but the potential E50 falls below the potential $V_{TH1}$, since the diode D52 is rendered conductive, the potential E52 of signal $V_{AGC2}$ is fixed at a certain level P2 or the potential $V_{TH2}$ as indicated by a part 204 in FIG. 8. Further, when the potential E52 exceeds $V_{TH2}$, the input potential difference E50-E52 of amplifier A50 increases as the potential $V_{AGC}$ increases. Accordingly, the potential of signal $V_{AGC1}$ is proportional to that of $V_{AGC}$ as indicated by a part 206 in FIG. 8. When the potential E50 reaches to the potential $V_{TH1}$, the diode D50 is turned on, and the potential of signal $V_{ACG1}$ is saturated at a certain level P1 corresponding to the potential $V_{TH1}$ as indicated by a part 208 in FIG. 8.

Figure 9:
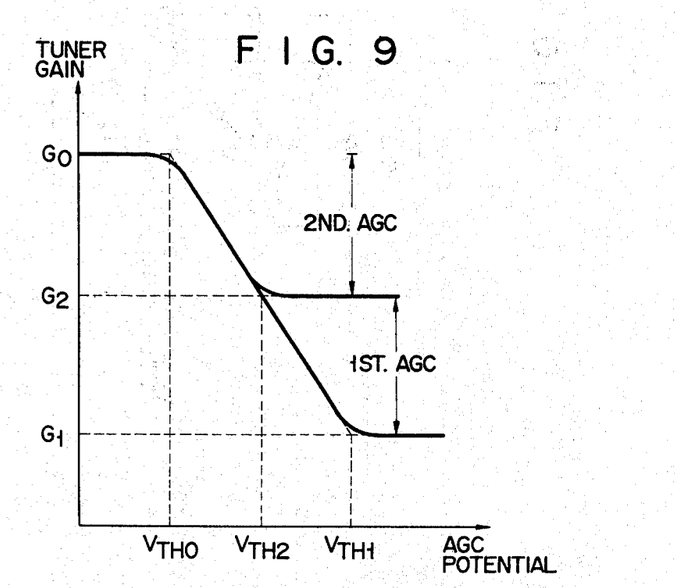
FIG. 9 shows a relation between a voltage potential of AGC signal and a total RF gain of the tuner.

FIG. 9 shows a relation between the AGC potential and a tuner gain or total RF gain. When the AGC potential falls below a threshold level $V_{TH0}$, no signal attenuation is effected at both the first AGC circuit 2 and second AGC circuit 7B. At this time the tuner gain is a maximum G0. When the AGC potential falls between the level $V_{TH0}$ and a threshold level $V_{TH2}$, since the second control signal $V_{AGC2}$ or the base voltage V28 is varied according to the AGC potential and the first control signal $V_{AGC1}$ is fixed, only the second AGC circuit 7B is activated, and a second AGC of delayed AGC system is effected. When the AGC potential reaches to the level $V_{TH2}$, a crossover gain G2 is obtained.

When the AGC potential exceeds the level $V_{TH2}$, the potential of $V_{AGC2}$ is no longer increased, while the potential of $V_{AGC1}$ begins to grow. Accordingly, the second AGC circuit 7B saturates in its operation but the first AGC circuit 2 is rended operative, and a first AGC of delayed AGC system is effected. When the AGC potential gets in touch with a threshold level $V_{TH1}$, the tuner gain is saturated at a minimum gain G1.

Figure 8:
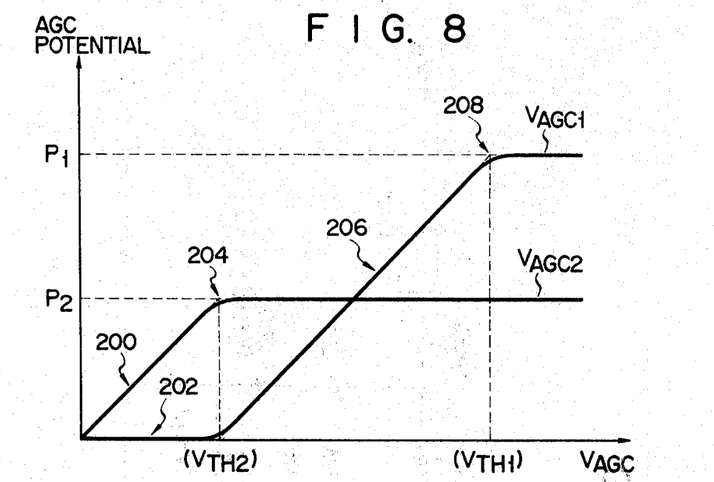
FIG. 8 shows a relation between a voltage potential of AGC signal $V_{AGC}$ obtained from a second superheterodyne section of FIG. 1 and AGC control potentials $V_{AGC1}$ and $V_{AGC2}$ for first and second AGC circuit of FIG. 7.

As seen from FIGS. 7 to 9, a first AGC of delayed AGC for a strong field strength is effected in the first AGC circuit 2, and a second AGC of delayed AGC for a weak field strength is effected in the second AGC circuit 7B which is combined with a UHF/VHF switch 7A. Such delayed AGC system including the combination of the UHF/VHF switch 7A and the second AGC circuit 7B improves the noise figure of a wide band TV tuner.

Incidentally, the inclinations or slants of curve of $V_{ACG1}$ (FIG. 8) and first AGC (FIG. 9) may freely be changed according to the gain of the amplifier A50 (FIG. 7). Also, the maximum amount of DC current I26 fed to the transistor 26 (FIG. 3) may be trimmed by the resistor 27. Thus, the upper limit of the gain of second AGC circuit 7B may be changed or trimmed by the resistor 27.

Figure 10:
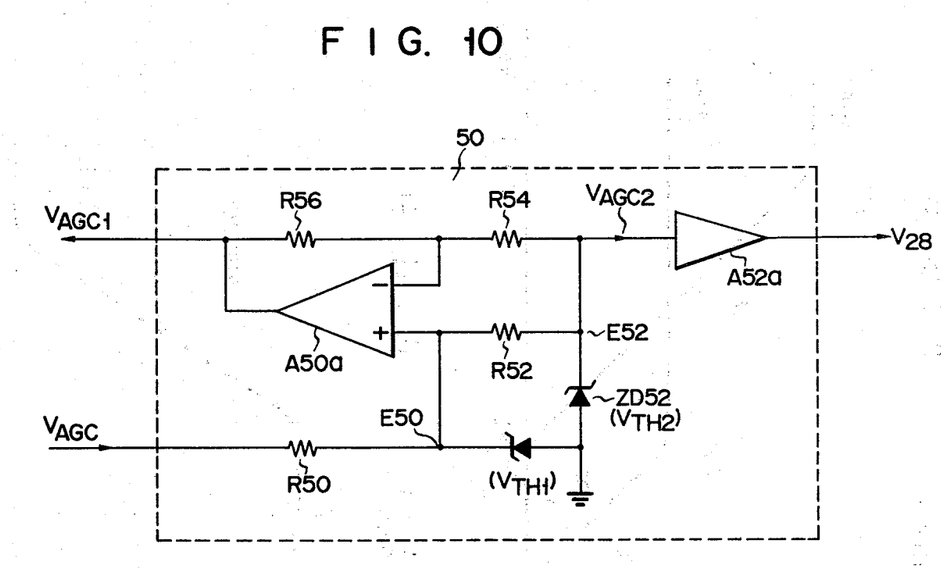
FIG. 10 shows a modification of FIG. 7.

FIG. 10 shows a modification of FIG. 7. In FIG. 10 circuitry, when the potential of $V_{AGC}$ falls below a Zener voltage $V_{TH2}$ of Zener diode ZD52, the closed loop gain of OP amplifier A50a is nearly 0 dB. While the potential of $V_{AGC}$ exceeds $V_{TH2}$, since the cathode potential E52 of diode ZD52 is fixed, the closed loop gain of amplifier A50a is changed from 0 dB to 20 $\log_{10}$ (1+R56/R54) dB. Therefore, the potential change of $V_{AGC1}$ is small when E52<$V_{TH2}$, while the potential change of $V_{AGC1}$ is large to render the first AGC effective when E52>$V_{TH2}$.

This invention should not be limited to the above-mentioned embodiments. Without departing from the scope of this invention, various modifications may be made.

Figure 11:
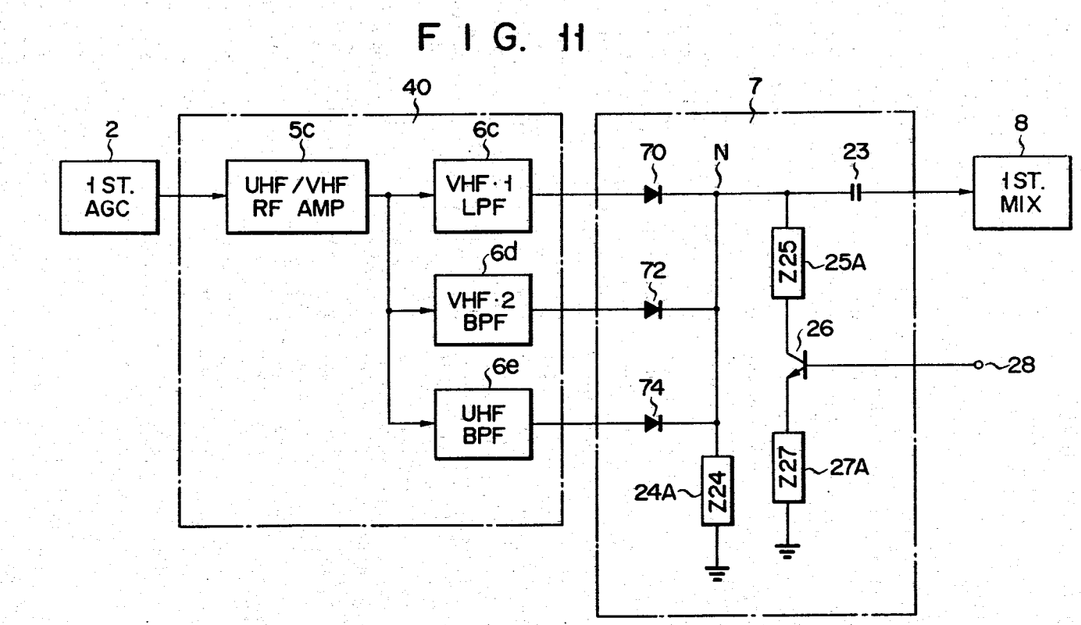
FIG. 11 shows a modification of FIG. 3.

Although the embodiment mentioned above employs a VHF RF amplifier and a UHF RF amplifier independently, the present invention is not restricted to such embodiment. Thus, for instance, the RF amplifier may be one as shown in FIG. 11. In this figure an output signal of UHF/VHF RF amplifier 5c is inputted to an LPF 6c, a BPF 6d and a BPF 6e. The LPF 6c passes only a lower channel frequency signal of VHF included in the output signal of amplifier 5c. The BPF 6d extracts from the output signal a higher channel frequency signal of VHF, and the BPF 6e extracts a UHF signal. Any one of the output signal of LPF 6c, BPF 6d and BPF 6e is coupled to a coupling node N through one of switching diodes 70, 72 and 74 which is forwardly biased by the power source potential of filter 6c, 6d or 6e.

Other circuit connections of FIG. 11 are substantially identical with that of FIG. 3. However, impedances 24A, 25A and 27A (FIG. 11) corresponding to resistors 24, 25 and 27 (FIG. 3) may include not only resistance but also inductance and/or capacitance.

According to a wide band TV tuner of the present invention, a delayed AGC is effected between an input stage AGC circuit and an additional AGC circuit of UHF/VHF selection switch to minimize the increase of noise figure so that the degradation of TV picture S/N is avoided.

What is claimed is:
1. An AGC system for a wide band tuner comprising:
 (a) AGC means for passing an input signal with a first given gain to provide a level-controlled signal, said level-controlled signal including a first signal in a first frequency band and a second signal in a second frequency band;

(b) circuit means coupled to said AGC means for signal-processing said level-controlled signal to provide a third signal and a fourth signal, said third signal including components in said first frequency band and said fourth signal including components in to said second frequency band;

(c) selection/AGC means coupled to said circuit means for selecting either one of said third signal and said fourth signal and providing the selected signal as an output signal with a second given gain, said output signal selectively including components in said first frequency band or said second frequency band;

(d) control signal source means coupled to said AGC means and said selection/AGC means for governing said first and second given gains in accordance with the level of said output signal; and (e) tuning means coupled to said selection/AGC means to provide an intermediate frequency signal in response to said output signal.

2. An AGC system according to claim 1 wherein said selection/AGC means includes:

switch means for selectively passing one of said third and fourth signals to provide the selected signal; and second AGC means coupled to said switch means and control signal source means for varying the magnitude of said selected signal to provide said output signal, said second given gain corresponding to the gain of said second AGC means.

3. An AGC system according to claim 1 or 2 wherein said control signal source means includes:

first means responsive to a control voltage corresponding to said output signal level, for generating a first gain control signal when the potential of said control voltage exceeds a given threshold potential, said first gain control signal controlling said first given gain of said AGC means; and second means responsive to said control voltage for generating a second gain control signal when the potential of said control signal falls from said given threshold potential, said second gain control signal controlling said second given gain of said selection/AGC means.

4. An AGC system according to claim 3 wherein said control signal source means further includes:

third means responsive to the potential of said control voltage for determining a lower limit of the potential of said first gain control signal and an upper limit of the potential of said second gain control signal according to said given threshold potential.

5. An AGC system according to claim 1 wherein said selection/AGC means includes:

a first switching diode for passing said third signal to a coupling node only when said first switching diode is forwardly biased with a direct current;

a second switching diode for passing said fourth signal to said coupling node only when said second switching diode is forwardly biased with a direct current; and current feeding means coupled to said control signal source means and connected between said coupling node and a circuit with a reference potential, for feeding said direct current passing through either one of said first and second switching diodes to control said second given gain.

6. An AGC system according to claim 5 wherein said current feeding means includes:

a transistor having an input electrode (base or gate), an output electrode (collector or drain) and a common electrode (emitter or source), said input electrode receiving a control potential corresponding to said output signal level, said output electrode being coupled to said coupling node; and an adjustment impedance connected between the common electrode of said transistor and said reference potential circuit, for adjusting a change rate of said second given gain versus the level of said control potential.

7. An AGC system according to claim 6 further includes:

a limiter impedance connected between said coupling node and said reference potential circuit for determining a lower limit of said second given gain.

8. An AGC system according to claim 6 or 7 further includes:

a trimmer impedance connected between said coupling node and the output electrode of said transistor for trimming an upper limit of said second given gain.

9. An AGC system for a wide band TV tuner comprising:

(a) first AGC means for attenuating an antenna input signal of VHF and UHF TV bands with a first given attenuation degree to provide a first attenuated signal, said first attenuated signal including a first VHF signal and a first UHF signal;

(b) VHF amplifier means coupled to said first AGC means for extracting said first VHF signal from said first attenuated signal and amplifying the extracted VHF signal to provide a second VHF signal;

(c) UHF amplifier means coupled to said first AGC means for extracting said first UHF signal from said first attenuated signal and amplifying the extracted UHF signal to provide a second UHF signal;

(d) selection means coupled to said VHF amplifier means and UHF amplifier means for selectively passing one of said second VHF signal and second UHF signal to provide a selected signal;

(e) second AGC means directly coupled to said selection means for attenuating said selected signal with a second given attenuation degree to provide an RF output signal;

(f) double superheterodyne circuit means coupled to said second AGC means for doubly frequency-converting said RF output signal to produce an intermediate frequency signal and providing a control voltage whose potential corresponds to the magnitude of said intermediate frequency signal; and (g) control signal source means coupled to said first AGC means, second AGC means and double superheterodyne circuit means, for governing said first and second attenuation degrees according to the potential of said control voltage.

10. An AGC system according to claim 9 wherein said control signal source means includes:

first means responsive to said control voltage for generating a first gain control signal when the potential of said control voltage exceeds a given threshold potential, said first gain control signal controlling said first attenuation degree; and second means responsive to said control voltage for generating a second gain control signal when the potential of said control signal falls from said given threshold potential, said second gain control signal controlling said second attenuation degree.

11. An AGC system according to claim 10 wherein said control signal source means further includes:

third means responsive to the potential of said control voltage for setting a lower limit of the potential of said first gain control signal and an upper limit of the potential of said second gain control signal according to said given threshold potential.

12. An AGC system for a wide band TV tuner comprising:

an automatic gain controlled circuit provided in an input stage;

a plurality of wide frequency range RF amplifiers coupled to an output of said automatic gain controlled circuit, one of said RF amplifiers having a specific frequency band which differs from that of another RF amplifier;

a plurality of frequency selective circuits respectively coupled to outputs of said RF amplifiers, one of said frequency selective circuits having a specific frequency band which differs from that of another frequency selective circuit;

a switch circuit for selectively taking out an RF output signal of one of said frequency selective circuits; and a frequency mixer for converting the RF output signal selected by said switch circuit to an intermediate frequency signal, wherein said switch circuit is equipped with a gain controlled circuit, and said automatic gain controlled circuit performs, in cooperation with said gain controlled circuit, a delayed gain control.

13. An AGC system according to claim 12 wherein one wide frequency range RF amplifier is commonly used for plural frequency bands.

* * * * *